United States Patent
Lee et al.

(10) Patent No.: US 7,299,528 B2
(45) Date of Patent: Nov. 27, 2007

(54) METHOD FOR FORMING A MULTI-FREQUENCY SURFACE ACOUSTIC WAVE DEVICE

(76) Inventors: David M. Lee, 5170 Bear Claw La., Rockwall, TX (US) 75032; Paul Lindars, 6056 E. Lovers La., #257, Dallas, TX (US) 75206; Christopher Ellis Jones, 1106 Courtside Dr., Arlington, TX (US) 76002; James E. Flowers, 4504 Southern Ave., Dallas, TX (US) 75205; Martin P. Goetz, 3425 Amherst Ave., Dallas, TX (US) 75225

( * ) Notice: Subject to any disclaimer, the term of this patent is extended or adjusted under 35 U.S.C. 154(b) by 380 days.

(21) Appl. No.: 10/288,529

(22) Filed: Nov. 5, 2002

(65) Prior Publication Data

US 2004/0083590 A1 May 6, 2004

(51) Int. Cl.
*H04R 17/00* (2006.01)
*H01L 41/00* (2006.01)

(52) U.S. Cl. .......................... 29/25.35; 29/594; 29/595; 29/832; 29/846; 29/847; 310/313 R (58) Field of Classification Search ............... 29/25.35, 29/594, 595, 846, 847, 832; 310/313 R, 310/313 B, 334
See application file for complete search history.

(56) References Cited

U.S. PATENT DOCUMENTS

| | | | |
|---|---|---|---|
| 5,390,401 A | * | 2/1995 | Shikata et al. ............ 29/25.35 |
| 5,589,806 A | * | 12/1996 | Taguchi et al. ............ 333/193 |
| 5,895,996 A | * | 4/1999 | Takagi et al. ............ 310/313 R |
| 6,127,769 A | * | 10/2000 | Kadota et al. ............ 310/313 B |
| 6,246,148 B1 | | 6/2001 | Flowers et al. |
| 6,367,133 B2 | | 4/2002 | Ikada et al. |
| 6,495,398 B1 | | 12/2002 | Goetz |
| 6,507,097 B1 | | 1/2003 | Goetz et al. |
| 6,580,197 B2 | | 6/2003 | Flowers |
| 6,593,678 B1 | | 7/2003 | Flowers |
| 6,621,379 B1 | | 9/2003 | Goetz et al. |
| 6,639,150 B1 | | 10/2003 | Goetz et al. |
| 6,649,446 B1 | | 11/2003 | Goetz et al. |
| 6,650,205 B2 | | 11/2003 | Goetz et al. |
| 6,734,599 B1 | | 5/2004 | Flowers et al. |
| 6,744,336 B1 | | 6/2004 | Goetz et al. |

FOREIGN PATENT DOCUMENTS

JP           10-190390        *  7/1998

OTHER PUBLICATIONS

Xu et al. *A Theoretical and Experimental Study of Waveguide Coupled SAW Resonator Filters*, IEEE Transactions on Ultrasonics, Ferroelectrics, and Frequency Control, vol. 42, No. 4, Jul. 1995.

* cited by examiner

*Primary Examiner*—A. Dexter Tugbang
*Assistant Examiner*—Tai Van Nguyen (57) ABSTRACT

Provided is a method of manufacturing a multi-frequency surface acoustic wave (SAW) device on a common piezoelectric substrate. The method features varying the resonant frequency of waveguide elements of the SAW device using a single etch step. The etch step removes a sub-portion of multiple layers of conductive film disposed on the substrate.

7 Claims, 10 Drawing Sheets

METHOD FOR FORMING A MULTI-FREQUENCY SURFACE ACOUSTIC WAVE DEVICE

The present invention relates to integrated circuits. Specifically, the present invention is directed to a method for forming a surface acoustic wave (SAW) device.

A SAW device consists of coupled gratings that confine acoustic energy and leads to resonances, and of a coupled transducer that permits the excitation and detection of the acoustic waves. A typical structure of a SAW device 10 is shown in FIG. 1.

Figure 1:
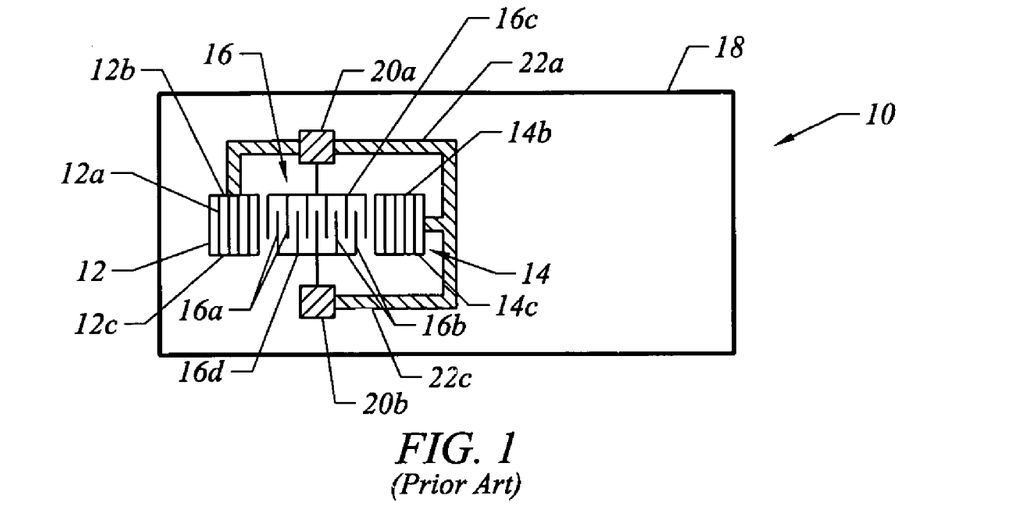
FIG. 1 is a simplified plan view of a prior art surface acoustic wave (SAW) device.

Referring to FIG. 1, SAW device 10 includes reflector elements 12 and 14 and a filter element 16 disposed on a substrate 18 and connected together with one or more I/O pads 20a and 20b employing interconnects 22a, 22b and 22c. Reflector elements 12 and 14 and filter element 16 produce a waveguiding effect on acoustic waves propagating therethrough, defining a plurality of waveguide elements.

To that end, reflector element 12 includes a plurality of spaced-apart conductive elements 12a extending parallel to each other. A first busbar 12b is connected in common with one end of each of conductive elements 12a, and a second busbar 12c is connected in common with the ends of conductive elements 12a disposed opposite to busbar 12b. Similarly, reflector element 14 includes a plurality of spaced-apart conductive elements 14a, with a first busbar 14b connected in common with one end thereof. A second busbar 14c is connected in common with the ends of conductive elements 14a disposed opposite to busbar 14b.

Filter element 16 includes first 16a and second 16b sets of conductive and spaced-apart interdigitated transducers (IDTs). An end of IDTs 16a disposed opposite to IDTs 16b is connected in common to busbar 16c, and an end of TDTs 16b disposed opposite to IDTs 16a are connected in common to a busbar 16d. Each of IDTs 16a extends from busbar 16c toward IDTs 16b and terminates spaced-apart from busbar 16d. Each of IDTs 16b extends from busbar 16d toward IDTs 16a and terminates spaced-apart from busbar 16c. The arrangement of IDTs 16a and 16b results in an IDT 16a extending between adjacent IDTs 16b and an IDT 16b extending between adjacent IDTs 16a.

The frequency of operation of SAW device 10 may be controlled, inter alia, as a function of the thickness of conductive elements 12a and 14a, as well as IDTs 16a and 16b. SAW device 10 is also easily manufactured in a cost-effective manner employing standard semiconductor processing techniques. These factors combine to make SAW device 10 desirable for use as an RF band-pass filter in portable communication devices, such as mobile phones and portable computers. As a result, there are many prior art techniques directed toward forming SAW devices.

U.S. Pat. No. 6,367,133 to Ikada et al. discloses, in pertinent part, a method of manufacturing a dual frequency surface acoustic wave apparatus. The apparatus includes first and second surface acoustic wave devices having different electrode film thicknesses on a common piezoelectric substrate. The method includes providing a piezoelectric substrate and forming a first conductive film on an entire surface of the piezoelectric substrate. A first resist layer is deposited over the entire surface of the first conductive film. The first resist layer is then patterned followed by a dry etch to form IDT electrodes of a first surface acoustic wave device, a short-circuit wiring electrode for establishing electrical connection between comb-shaped electrodes of the IDT electrodes, and a conductive film provided in a region including the entire area in which the second surface acoustic wave device is constructed. Thereafter, a wet etch is employed to remove the conductive film provided in the region including the entire area in which the second surface acoustic wave device is constructed. A second resist layer is then deposited on the entire surface of the piezoelectric substrate, and the substrate is then heated. In this manner, removed are portions of the second resist layer in superimposition with electrodes of the second surface acoustic wave device. This results in the formation of a second conductive film having the same film thickness as the electrode film thickness of the second-surface acoustic wave device. Thereafter, a lift process is employed to remove the second resist layer and the second conductive film deposited on the second resist. This forms the electrodes of the second surface acoustic wave device, exposes the electrodes of the first surface acoustic wave device and disconnects the short-circuit wiring electrode in the first surface acoustic wave device.

Japanese Unexamined Patent Application Publication No. 10-190390, discloses a method of manufacturing a surface acoustic wave apparatus in which a plurality of surface acoustic wave filter devices are disposed on a common piezoelectric substrate. To that end, a conductive film is formed on the piezoelectric substrate, and a resist is formed along the entire surface of the conductive film. Patterning of the resist is performed, forming a patterned resist layer. A dry etch process is employed to form electrodes of a first surface acoustic wave device. Thereafter, deposition of a second resist layer occurs, with a portion thereof not in superimposition with the first surface acoustic wave device being patterned, forming a patterned region in the second resist layer. A conductive film is deposited over the second resist layer, with a second acoustic wave device being formed in the patterned region thereof. Then a lift-off is performed leaving two sets of electrodes having differing thickness. A drawback with these techniques for producing SAW devices is the lengthy and complex steps required to provide the same with multiple frequency operation.

A need exists, therefore, to provide improved techniques for producing multiple frequency surface acoustic wave devices.

SUMMARY OF THE INVENTION

The present invention provides a method of manufacturing a surface acoustic wave device on a piezoelectric substrate. The method features varying the resonant frequency of waveguide elements, such as interdigitated transducer electrodes (IDTs), by a single etch step that removes a sub-portion of multiple layers of conductive film disposed on the substrate. To that end, one embodiment of the method includes forming a patterned resist layer, having gaps therein, on the piezoelectric substrate. The gaps in the resist layer expose portions of the piezoelectric substrate. Multiple layers of conductive material are formed with the gaps to produce a plurality of waveguide elements, such as IDTs. The waveguide elements have a resonant frequency associated therewith. The resonant frequency of a subset of the plurality of waveguide elements is varied by removing one of the multiple layers associated with the subset. To that end, an additional resist layer is disposed atop of the multiple layers of conductive films and the resist layer. A sub-section of the additional resist layer is removed to expose a sub-section of the multiple layers of conductive film and one of the layers of the same is removed. Thereafter, a lift off technique is employed to remove all material present on the substrate, excepting material associated with the waveguide elements. These and other embodiments of the invention are described more fully below.

DETAILED DESCRIPTION OF THE PREFERRED EMBODIMENTS

Figure 2:
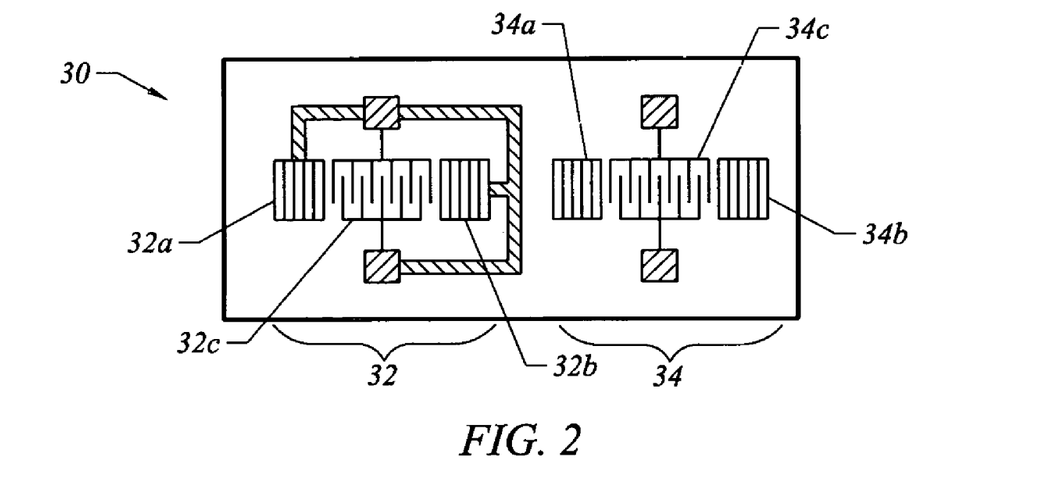
FIG. 2 is a simplified plan view of a dual frequency SAW device that may be formed in accordance with the present invention.

Referring to FIG. 2, a multi-frequency SAW device 30 in accordance with the present invention includes first 32 and second 34 SAW circuits. SAW circuit 32 includes a plurality of waveguide elements, such as a pair of reflector elements 32a and 32b with a filter element 32c connected therebetween. Reflector elements 32a and 32b and filter element 32c are electrically coupled as discussed above with respect to reflector elements 12 and 14 and filter element 16, of FIG. 1. Referring again to FIG. 2, SAW circuit 34 includes reflector elements 34a and 34b with a filter element 34c connected therebetween that are electrically coupled in a similar fashion.

Figure 3:
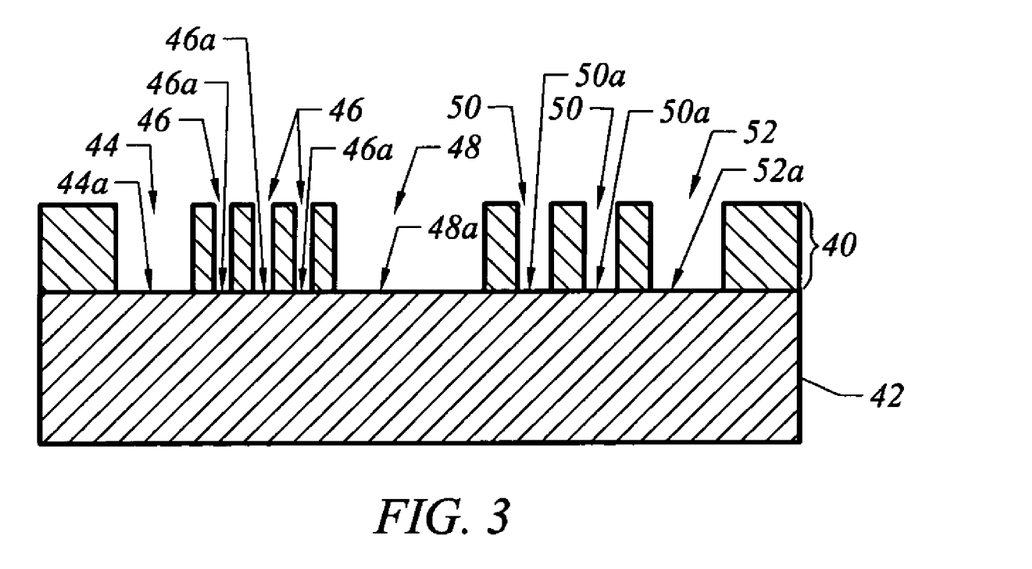
FIG. 3 is a cross-sectional view showing a piezoelectric substrate with a first patterned resist layer disposed thereon to form a SAW device in accordance with a first method of the present invention.

Referring to both FIGS. 2 and 3, in accordance with one embodiment of the present invention, the method to form multi-frequency SAW device 30 commences with depositing a resist layer 40 atop of a piezoelectric substrate 42. Substrate 42 may be formed from any known piezoelectric material, such as piezoelectric single crystal material, piezoelectric ceramic material and the like. Exemplary materials from which substrate 42 may be formed include $LiTaO_3$, $LiNbO_3$, $Li_2B_4O_7$, $La_3Ga_5SiO_{14}$ and $Pb(Zr_xTi_{1-x})O_3$. Alternatively, substrate 42 may be a standard semiconductor substrate formed, for example, from silicon and coated with a layer of piezoelectric material.

Resist layer 40 is patterned so as to have gaps 44, 46, 48, 50 and 52 present therein, exposing portions 44a, 46a, 48a, 50a and 52a of substrate 42. Gaps 44, 46, 48, 50 and 52 may have identical or differing dimensions provide portions 44a, 46a, 48a, 50a and 52a with identical or differing surface areas. Any type of resist material may be employed such as positive photoresist, negative photoresist and the like. Resist layer 40 may be deposited using known techniques, e.g., spin-on techniques.

Figure 4:
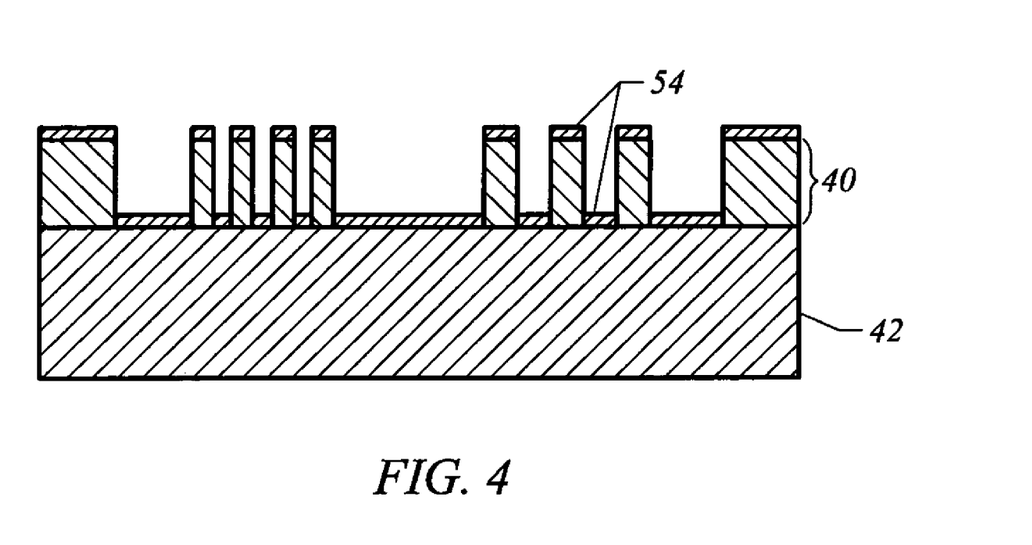
FIG. 4 is a cross-sectional view of the structure shown in FIG. 3 with an adhesion film disposed thereon, in accordance with the first method of the present invention.
Figure 5:
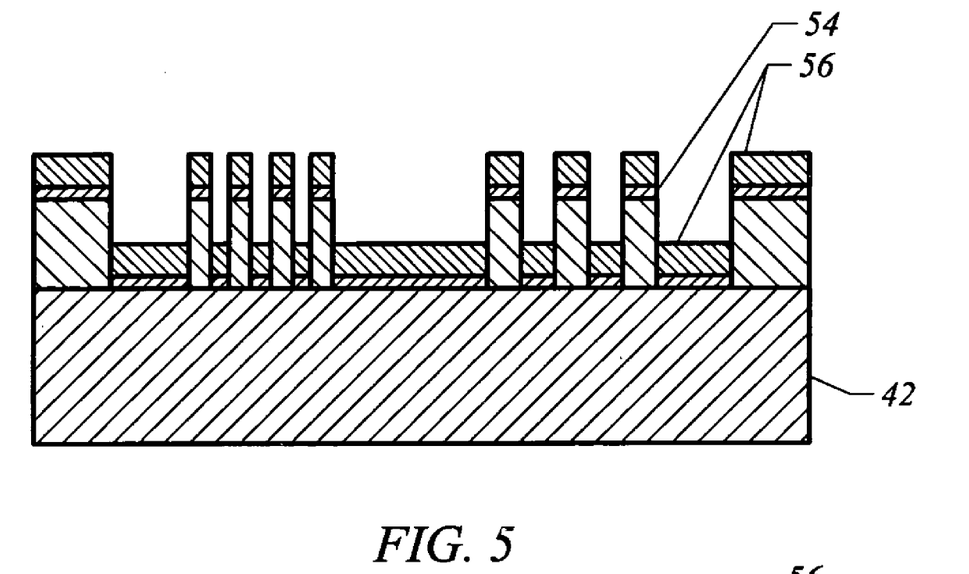
FIG. 5 is a cross-sectional view of the structure shown in FIG. 4 with a first conductive film disposed on the adhesion film, in accordance with the first method of the present invention.

Referring to FIGS. 3, 4 and 5, an adhesion layer 54 is deposited to cover resist layer 40 and portions 44a, 46a, 48a, 50a and 52a of substrate 42. The material from which adhesion layer 54 is formed facilitates desired adhesion between substrate 42 and a conductive film 56 formed adjacent thereto. Considering that conductive film 56 may be formed from any type of conductive material, adhesion layer 54 may be formed from any material suitable to facilitate adhesion between conductive film 56 and substrate 42. For example, conductive film 56 may be formed from titanium (Ti), aluminum (Al), nickel (Ni), tungsten (W) and copper (Cu), and adhesion layer 54 may be formed from any of the aforementioned materials, as well as titanium nitride (TiN) and/or chromium (Cr). In the present example, adhesion layer 54 is formed from titanium and conductive film 56 is formed from aluminum. The thickness of adhesion layer 54 is selected to have minimal effect on the desired operational frequencies of the resulting SAW device. In the present example, adhesion layer 54 has a thickness in a range of 20–50 angstroms. The thickness of conductive film 56 is chosen to define the operational frequency of SAW circuit 32, shown in FIG. 2. Referring again to FIG. 5, in the present example conductive film 56 has a thickness in a range of 1,500 to 2,500 angstroms. Both adhesion layer 54 and conductive film 56 may be deposited using any known deposition technique, such as, chemical vapor deposition, physical vapor deposition, electroplating and the like.

Figure 6:
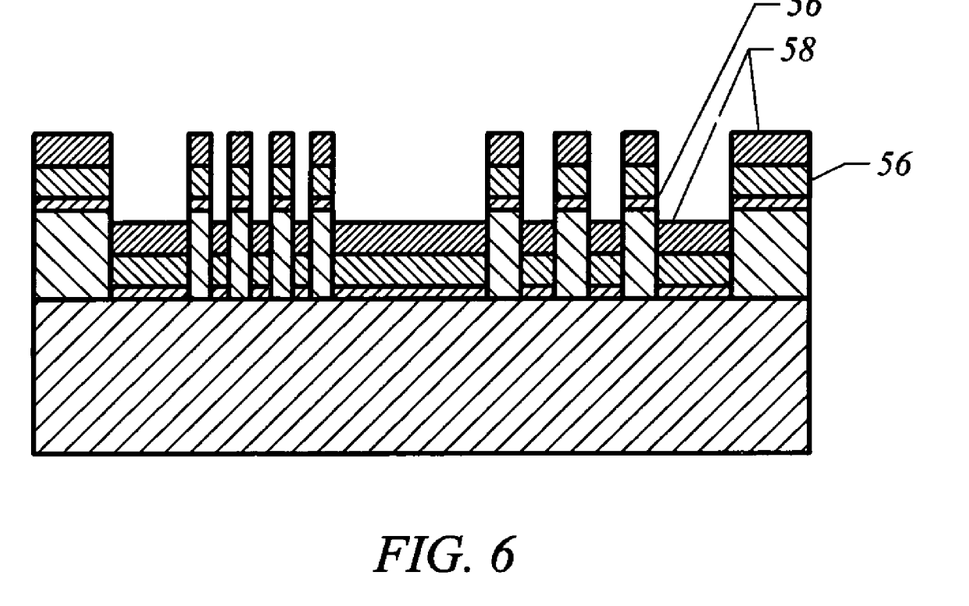
FIG. 6 is a cross-sectional view of the structure shown in FIG. 5 with a second conductive film disposed on the first conductive film, in accordance with the first method of the present invention.

Referring to FIG. 6, a second conductive film 58 is formed atop of conductive film 56. Conductive film 58 may be formed from material that is the same or different from the material from which conductive film 56 is formed. The thickness of conductive film 58 is selected to define the frequency of operation for SAW circuit 34, shown in FIG. 2, based upon the material employed to form second conductive film 58 and the presence of conductive film 56. In the present example, second conductive film 58 is formed from titanium material and has a thickness in a range of 500–1, 100 angstroms.

Figure 7:
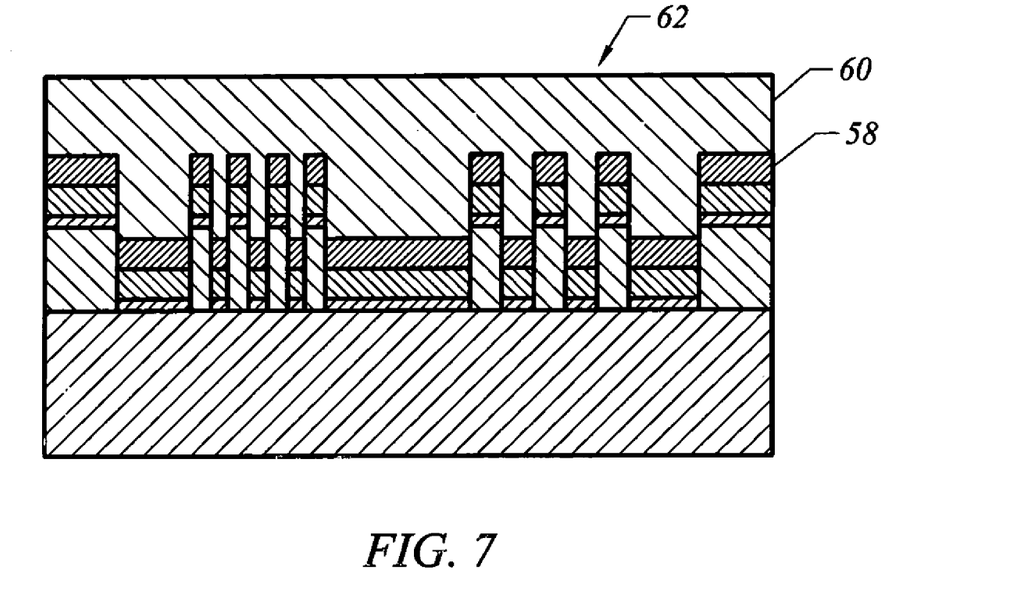
FIG. 7 is a cross-sectional view of the structure shown in FIG. 6 with a second resist layer disposed on the second conductive film, in accordance with the first method of the present invention.
Figure 8:
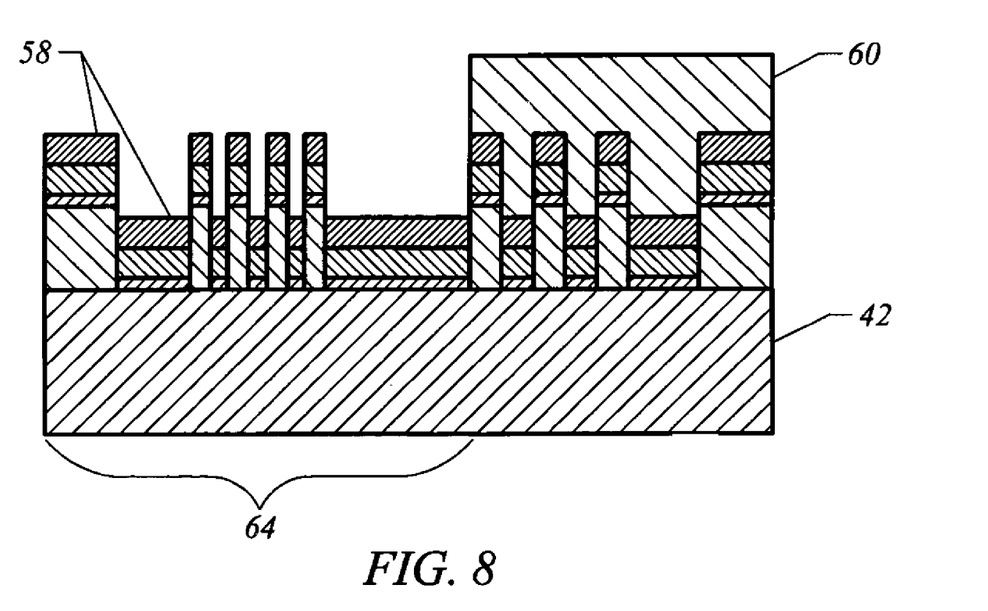
FIG. 8 is a cross-sectional view of the structure shown in FIG. 7 with a sub-section of the second resist layer being removed to expose the sub-portion of the second conductive film in superimposition therewith, in accordance with the first method of the present invention.

Referring to FIGS. 2, 7 and 8, formed atop of second conductive layer 58 is a second resist layer 60. Resist layer 60 is deposited to facilitate subsequent patterning and removal thereof so that a portion in superimposition with SAW circuit 34 remains while the portion in superimposition with SAW circuit 32 is removed. To that end, resist layer 60 may be deposited using any known process and to achieve any known topography. In the present example, resist layer 60 is formed employing a spin-on process to completely cover second conductive film 58 and define a planar surface 62. Thereafter, surface 62 is patterned so that a sub-section of resist layer 60 is developed away to expose a sub-portion of second conductive layer 58 in superimposition with a region 64 of substrate 42 in which SAW circuit 32 is formed.

Figure 9:
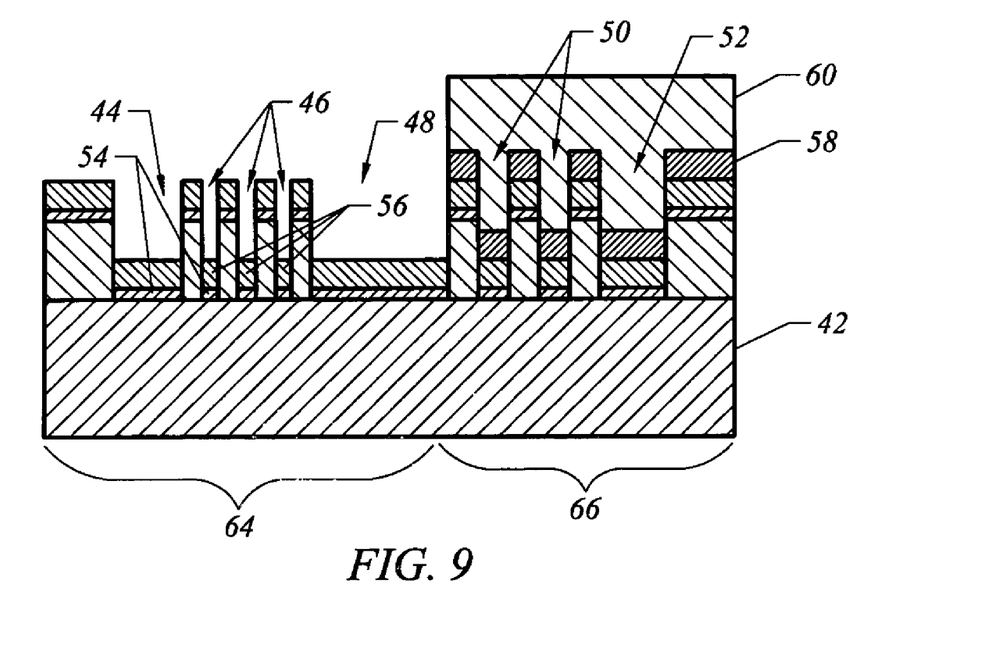
FIG. 9 is a cross-sectional view of the structure shown in FIG. 8 with the sub-portion of the second conductive film being removed, exposing the first conductive film in superimposition with the sub-portion.
Figure 10:
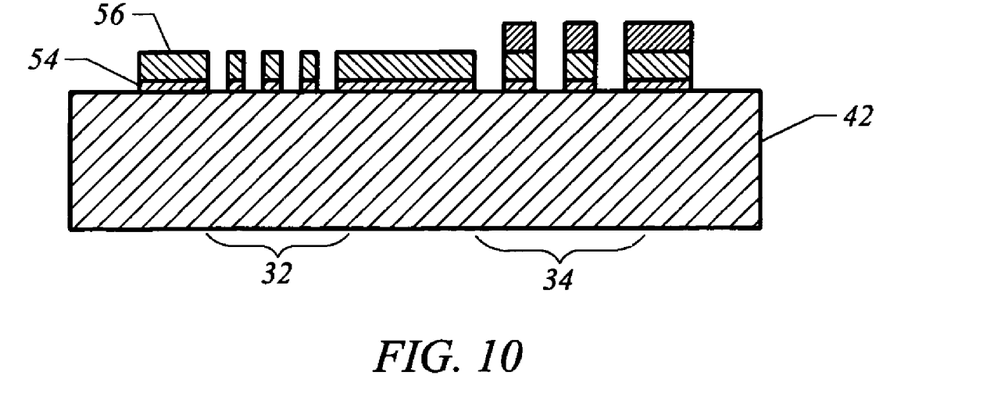
FIG. 10 is a cross-sectional view of the structure shown in FIG. 9 after a lift-off technique to form a dual frequency SAW device, in accordance with the first method of the present invention.

Referring to FIGS. 8 and 9, region 64 is exposed to an etch process, e.g., wet or dry etch processes, to remove the area of second conductive film 58 in superimposition with region 64. In this manner, the etch process varies the frequency associated with SAW circuit 32, shown in FIG. 2, so that the frequency is defined by the thickness of conductive film 56 in gap 46, shown in FIG. 9. Thereafter, a lift off technique is employed to remove all material from substrate 42 in superimposition with region 64, excepting conductive film 56 and adhesion layer 54 disposed in gaps 44, 46 and 48. The lift off technique also removes all material from substrate 42 in superimposition with region 66, excepting adhesion layer 54, as well as first 56 and second 58 conductive films disposed in gaps 50 and 52. In this manner, SAW circuits 32 and 34 are formed on substrate 42, shown in FIG. 10.

Figure 11:
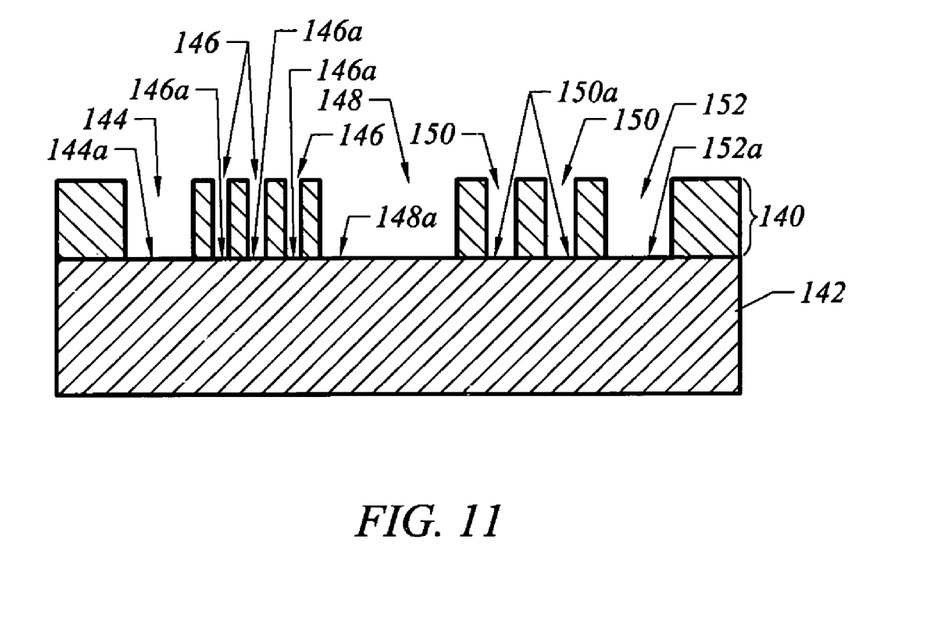
FIG. 11 is a cross-sectional view showing a piezoelectric substrate with a second patterned resist layer disposed thereon to form a SAW device in accordance with a second method of the present invention.

In accordance with another embodiment of the present invention, the method to form multi-frequency SAW device 30, shown in FIG. 2, commences with deposition of a resist layer 140 atop of a piezoelectric substrate 142, shown in FIG. 11. In this manner, portions of resist layer 140 are provided with gaps 144, 146, 148, 150 and 152 present therein to expose portions 144*a*, 146*a*, 148*a*, 150*a* and 152*a* of substrate 142.

Figure 12:
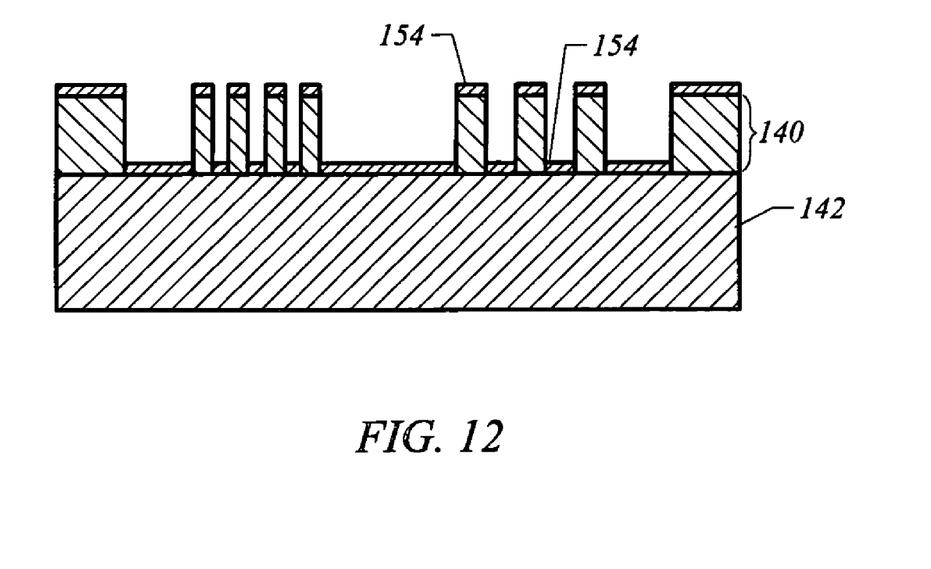
FIG. 12 is a cross-sectional view of the structure shown in FIG. 11 with an adhesion film disposed thereon, in accordance with the second method of the present invention.
Figure 13:
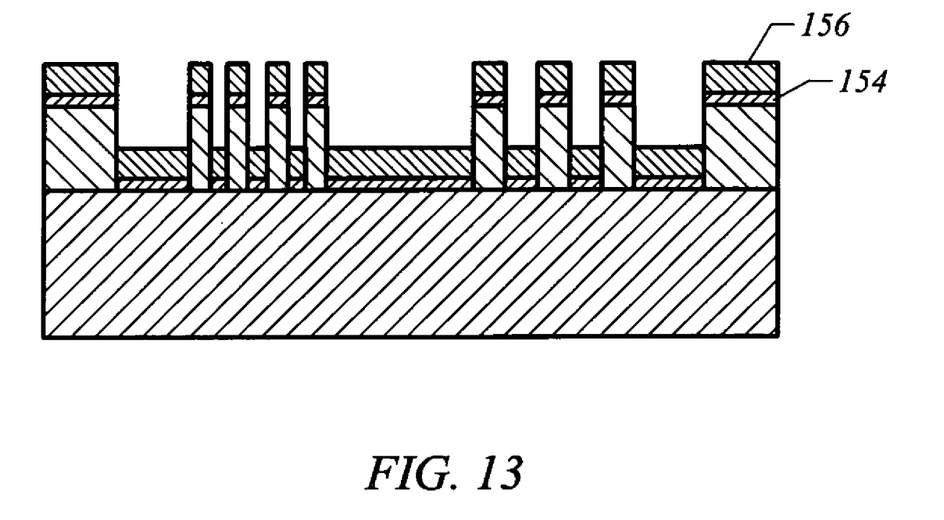
FIG. 13 is a cross-sectional view of the structure shown in FIG. 12 with a first conductive film disposed on the adhesion film, in accordance with the second method of the present invention.

Referring to both FIGS. 11 and 12, an adhesion layer 154 is deposited to cover resist layer 140 and portions 144*a*, 146*a*, 148*a*, 150*a* and 152*a*. A first conductive film 156 is deposited to cover adhesion layer 154, shown in FIG. 13. Adhesion layer 154 and first conductive film 156 may be formed from any suitable material. In the present example adhesion layer 154 is formed from titanium and first conductive film 156 is formed from aluminum having a thickness in a range of 1,500 to 2,500 angstroms.

Figure 14:
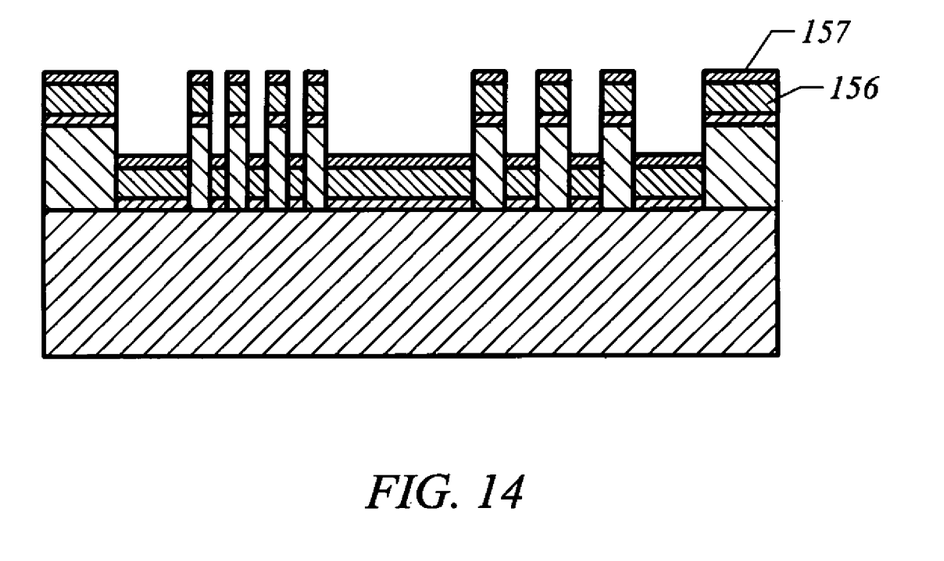
FIG. 14 is a cross-sectional view of the structure shown in FIG. 13 with a cap film disposed on the conductive film, in accordance with the second method of the present invention.

Referring to FIG. 14, a cap layer 157, or etch stop layer, is deposited over first conductive film 156. Cap layer 157 functions to prevent compromise of the structural integrity of first conductive film 156 when subjected to etchants. As a result, any suitable material may be employed to form cap layer 157, dependent upon the etching chemistries. In the present example, cap layer 157 is formed from titanium or chromium and has a thickness associated therewith that has minimal influence on the desired operational frequency of SAW circuits 32 and 34, shown in FIG. 2.

Figure 15:
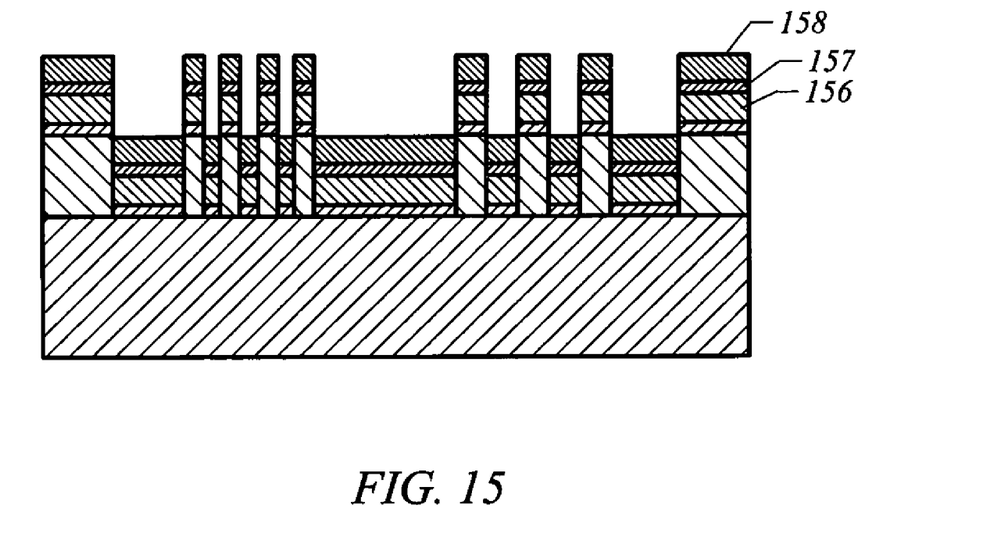
FIG. 15 is a cross-sectional view of the structure shown in FIG. 14 with a second conductive film disposed on the cap film, in accordance with the second method of the present invention.

Referring to FIG. 15, following formation of cap layer 157, a second conductive film 158 is formed atop of cap layer 157. Conductive film 158 may be formed from material that is the same or different from the material from which conductive film 156 is formed. The thickness of conductive film 158 is selected to define the frequency of operation for SAW circuit 34, shown in FIG. 2, based upon the material employed to form second conductive film 158, shown in FIG. 15. In the present example, second conductive film 158 is formed from aluminum (Al) and has a thickness in a range of 2,500 to 4,500 angstroms.

Figure 16:
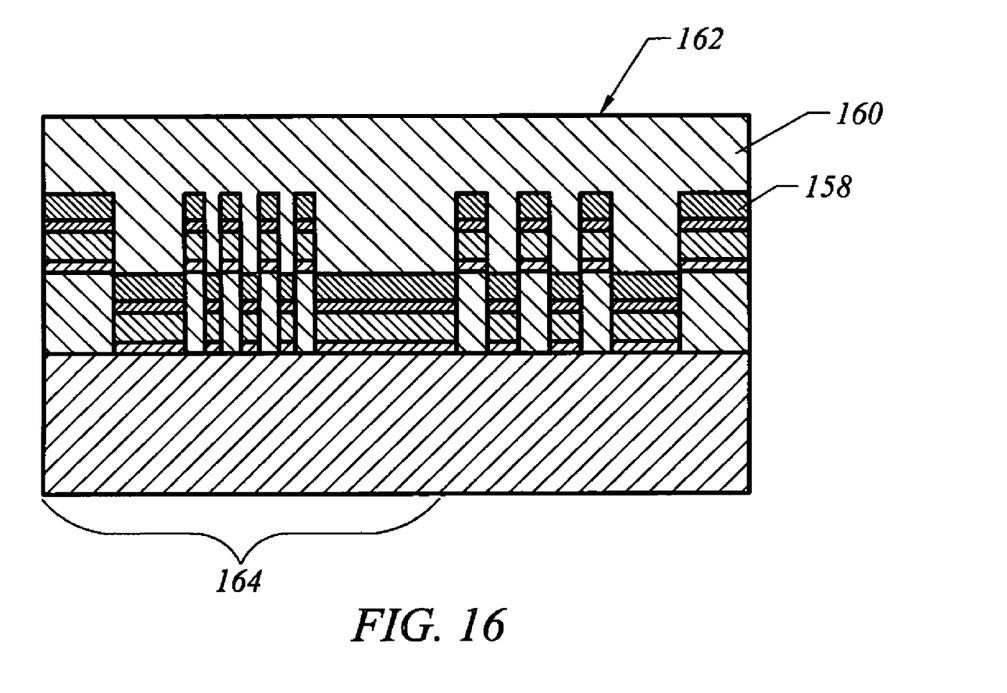
FIG. 16 is a cross-sectional view of the structure shown in FIG. 15 with a second resist layer disposed on the second conductive film, in accordance with the second method of the present invention.
Figure 17:
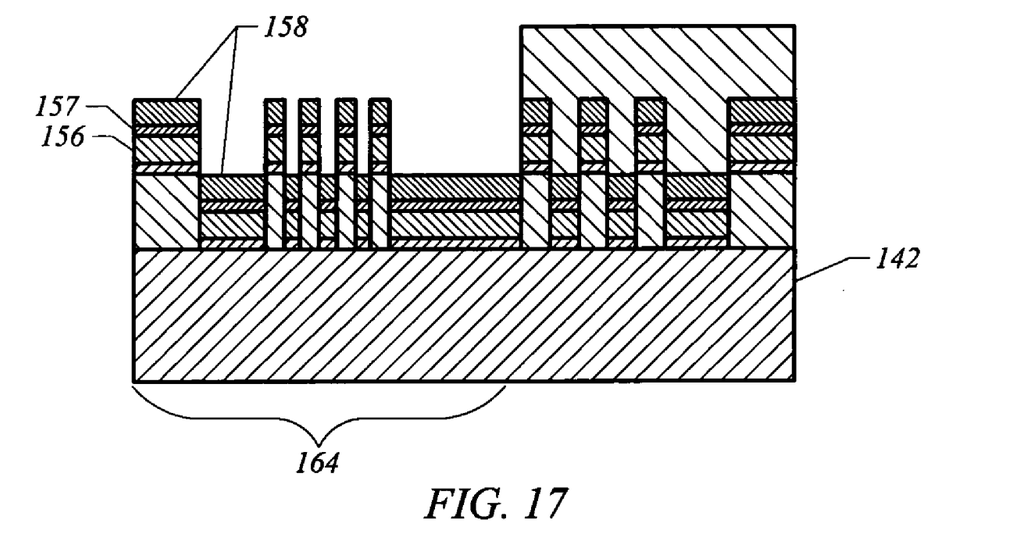
FIG. 17 is a cross-sectional view of the structure shown in FIG. 16 with a sub-section of the second resist layer being removed to expose the sub-portion of the second conductive film in superimposition therewith, in accordance with the second method of the present invention.

Referring to FIGS. 16 and 17, formed atop of second conductive film 158 is a second resist layer 160. Resist layer 160 is deposited to facilitate subsequent patterning and removal thereof so that a portion thereof remains in superimposition with SAW circuit 34, shown in FIG. 2, while the portion in superimposition with SAW circuit 32, shown in FIG. 2, is removed. Resist layer 160 may be deposited using any known process to achieve any known topography. In the present example, resist layer 160 is formed employing a spin-on process to completely cover second conductive film 158 and define a planar surface 162. Thereafter, surface 162 is patterned so that a sub-section of resist layer 160 is developed away to expose a sub-portion of second conductive layer 158 in superimposition with a region 164 of substrate 142 in which SAW circuit 32, shown in FIG. 2, is formed.

Figure 18:
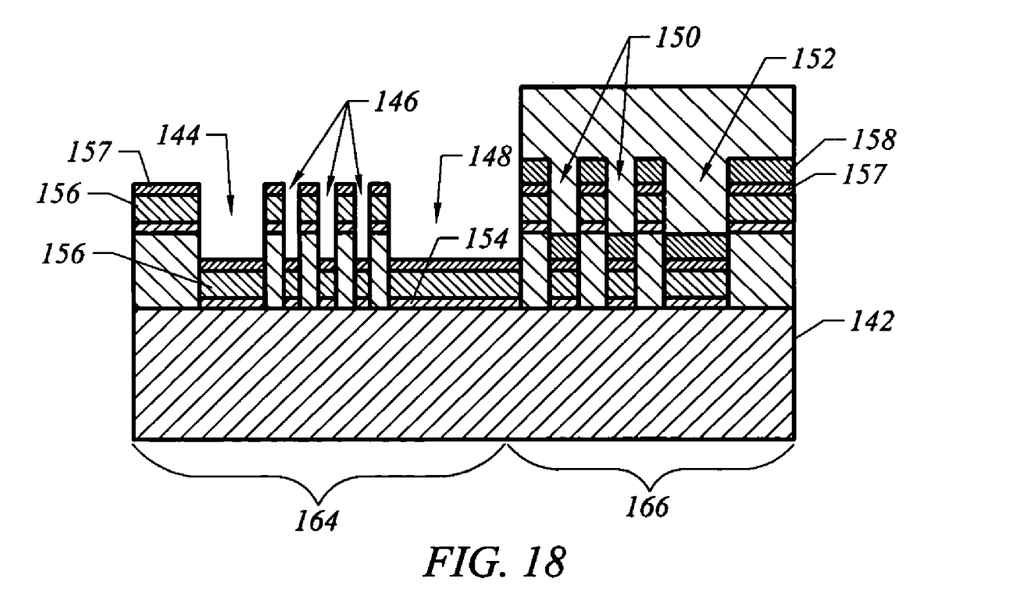
FIG. 18 is a cross-sectional view of the structure shown in FIG. 17 with the sub-portion of the second conductive film being removed, exposing the cap film in superimposition therewith.
Figure 19:
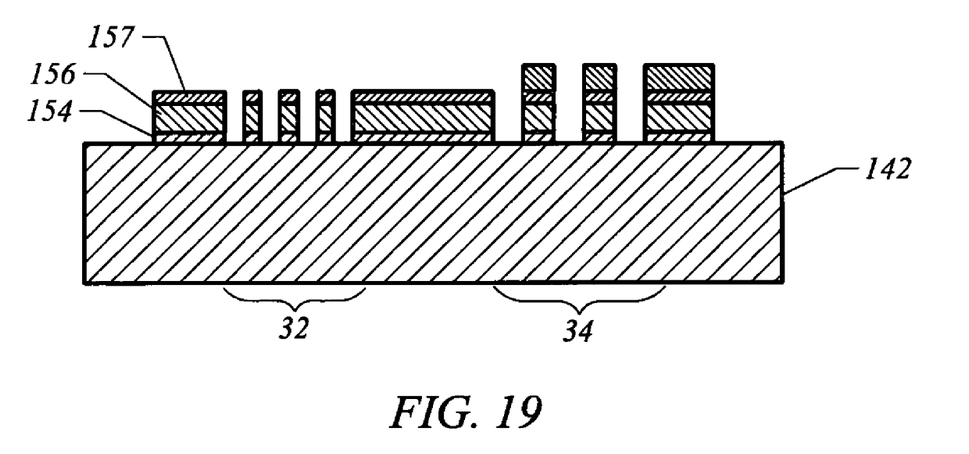
FIG. 19 is a cross-sectional view of the structure shown in FIG. 18 after a lift-off technique to form a dual frequency SAW device, in accordance with the second method of the present invention.

Referring to FIGS. 17 and 18, a sub-portion of second conductive film 158 in superimposition with region 164 is exposed to an etch process, e.g., wet or dry etch processes. This removes the sub-portion of second conductive film 158 in superimposition with region 164. The presence of cap layer 157 maintains the structural and electrical integrity of conductive film 156 in the presence of the etching chemistry. In this manner, the etch process varies the frequency associated with SAW circuit 32, shown in FIG. 2, so that the frequency is defined by the thickness of conductive film 156 in gap 146, shown in FIG. 18. Thereafter, a lift off technique is employed to remove all material from substrate 142 in superimposition with region 164, excepting cap layer 157, conductive film 156 and adhesion layer 154 disposed in gaps 144, 146 and 148. The lift off technique also removes all material from substrate. 142 in superimposition with region 166, excepting adhesion layer 154, as well as first conductive film 156, cap layer 157 and second conductive film 158 disposed in gaps 150 and 152. In this manner, SAW circuits 32 and 34 are formed on substrate 142, shown in FIG. 19.

The embodiments of the present invention described above are exemplary and the scope of the invention should, therefore, not be determined with reference to the above description. Rather, the scope of the invention should be determined with reference to the appended claims along with their full scope of equivalents.

What is claimed is:

1. A method of manufacturing a surface acoustic wave device on a piezoelectric substrate, said method comprising: forming a patterned resist layer on said piezoelectric substrate having gaps present therein exposing portions of said piezoelectric substrate in superimposition therewith; forming a plurality of waveguide elements by forming, within said gaps, multiple layers of conductive material, with said plurality of waveguide elements defining a resonant frequency associated therewith; and varying said resonant frequency associated with a subset of said plurality of waveguide elements by removing one of said multiple layers associated with said subset, wherein forming said plurality of waveguide elements further includes forming a first conductive layer over said patterned resist layer and said portions and forming a second conductive layer over said first conductive layer, with said second conductive layer having a thickness at least as great as a thickness of said first conductive layer.

2. The method as recited in claim 1 wherein varying said resonant frequency further includes covering said multiple layers of conductive material with resist material and removing a sub-portion of said resist material to expose a sub-section of said multiple conductive layers and etching one of said multiple conductive layers in said sub-section.

3. The method as recited in claim 1 wherein each of said multiple layers of conductive material includes material selected from a set consisting of Ti, Al, Ni, W and Cu, and said substrate includes compounds selected from a set of compounds consisting of $LiTaO_3$, $LiNbO_3$, $Li_2B_4O_7$, $La_3Ga_5SiO_{14}$ and $Pb(Zr_xTi_{1-x})O_3$.

4. The method as recited in claim 1 further including forming said piezoelectric substrate by forming a piezoelectric layer atop of a semiconductor wafer, with said piezoelectric layer including material selected from a set of materials consisting of a piezoelectric single crystal and a piezoelectric ceramic.

5. The method as recited in claim 1 wherein forming said plurality of waveguide elements further includes forming an adhesion layer formed from a first material forming adjacent to said patterned resist layer and said portions and depositing a conductive film, formed from a second material, adjacent to said adhesion film, wherein said first and second materials differ.

6. The method as recited in claim 5 wherein forming said plurality of waveguide elements further includes depositing a cap layer adjacent to said first conductive film and depositing an additional conductive film adjacent to said cap layer.

7. The method as recited in claim 1 wherein forming said patterned resist layer further includes providing said gaps present therein with differing dimensions, with a first subgroup having dimensions differing from the dimensions associated with gaps associated with a second subgroup of said gaps.

* * * * *